United States Patent
Chen et al.

(10) Patent No.: US 7,714,443 B2
(45) Date of Patent: May 11, 2010

(54) PAD STRUCTURE DESIGN WITH REDUCED DENSITY

(75) Inventors: Hsien-Wei Chen, Sinying (TW); Anbiarshy Wu, Chiayi (TW); Shih-Hsun Hsu, Keelung (TW); Shang-Yun Hou, Jubei (TW); Hsueh-Chung Chen, Yonghe (TW); Shin-Puu Jeng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 237 days.

(21) Appl. No.: 11/458,501

(22) Filed: Jul. 19, 2006

(65) Prior Publication Data

US 2008/0020559 A1    Jan. 24, 2008

(51) Int. Cl.
  *H01L 23/52* (2006.01)
(52) U.S. Cl. .................. 257/758; 257/773; 257/781; 257/E23.019; 257/E23.142
(58) Field of Classification Search ......... 257/773–775, 257/758, 781, E23.015, E23.019, E23.142, 257/E23.145, E23.152
See application file for complete search history.

(56) References Cited

U.S. PATENT DOCUMENTS

| 6,306,750 | B1 | 10/2001 | Huang et al. |
| 6,365,967 | B1 | 4/2002 | Akram et al. |
| 6,642,623 | B2 | 11/2003 | McTeer |
| 6,709,965 | B1 | 3/2004 | Chen et al. |
| 6,890,828 | B2 | 5/2005 | Horak et al. |
| 7,160,795 | B2 | 1/2007 | Batra et al. |
| 2004/0058520 | A1* | 3/2004 | Burrell et al. ............... 438/612 |
| 2005/0093176 | A1* | 5/2005 | Hung et al. ................. 257/786 |
| 2007/0268105 | A1* | 11/2007 | Walls ......................... 336/200 |

* cited by examiner

*Primary Examiner*—Matthew E Warren
(74) *Attorney, Agent, or Firm*—Duane Morris LLP; Steven E. Koffs

(57) ABSTRACT

An interconnect structure includes at least a first interconnect layer and a second interconnect layer. Each of the first and second interconnect layers has a pad structure and each pad structure has a respective pad density. The pad density of the pad structure of the second interconnect layer is different from the pad density of the pad structure of the first interconnect layer. The pad structures of the first and second interconnect layers are connected to each other.

20 Claims, 4 Drawing Sheets

PAD STRUCTURE DESIGN WITH REDUCED DENSITY

FIELD OF THE INVENTION

The present invention relates generally to semiconductor chips and more particularly to interconnect structures and methods for semiconductor integrated circuits (ICs).

BACKGROUND OF THE INVENTION

In order to achieve high-integration and high-speed, dimensions of semiconductor integrated circuits have been reduced, and various materials and techniques have been proposed and used during fabrication. For example, dual damascene technology and copper conductors are applied to reduce resistances and resistance-capacitance (RC) delay of interconnect structures in ICs. As ICs are made smaller, and the distance between adjacent lines is reduced, low-k (low dielectric constant) dielectric materials are used in advanced copper interconnect technology to reduce these delays.

Interconnect structures of semiconductor ICs connect the various active devices and circuits of the IC to a plurality of conductive pads on the external surface of the die. Multi-level interconnect structures have been developed that accommodate the advances in active-device density by more effectively routing conductive paths between the active devices and the surface of the die. In typical IC designs, five or more individual interconnect levels of conductive paths may be used to accommodate the active-device density. Multi-level interconnect structures arrange the metallization lines in multiple layers. The metallization lines of each individual level are formed in an interlevel dielectric (ILD) material. The ILD electrically isolates the metallization lines from one another within each level of the interconnect structure and electrically isolates metallization lines in adjacent levels.

Damascene processes are routinely used in back-end-of-line (BEOL) processing for fabricating multi-level interconnect structures. In a damascene process, trenches and vias are etched in a layer of ILD and filled with a conductive material, such as copper (Cu) or a Cu-based alloy, to create conductive lines and vertical conductive paths between the interconnect lines in different levels.

The conductive paths of the multi-level interconnect structures terminate in bond pads at the surface of the IC. The bond pads are relatively large metal areas distributed about the die. Bond pads are used to establish electrical contact between the integrated circuits and either a package substrate of an IC package or a probe pin (that is used for wafer acceptance testing, or WAT). The pads used during WAT are also referred to as, "process control monitor (PCM) pads". A probe makes an electrical contact between a probe pin and the bond pads, so voltage or current can be applied to test for device functionality and performance. Large bond pads allow longer probe needles, thus increasing parallel testing capability. The bond pads that are used for WAT may be distributed in the scribe lines between dies. These scribe lines are severed during the die singulation process, with the cuts passing through the bond pads.

A conventional approach for configuring the WAT bond pads of the interconnect structure is to include bond pads in the scribe line on each interconnect layer, aligned beneath the bond pads in scribe line of the top metal layer, and to include metal-filled vias connecting the bond pads in each of the interconnect levels, aligned beneath each bonding pad or probe pad in the top metal layer. The bond pads in the first interconnect (M1) layer may be used for in situ testing before the second (M2) through top metal (MT) layers are formed.

The dicing (or singulation) process can produce a large mechanical stress, which may be dependent on numerous conditions, including: cut width, die saw speed, die saw temperature, die saw pressure, etc.

Conventional multi-level interconnect structures have been susceptible to failure due to cracking when the PCM pad is cut by a die saw. Experience has shown that during singulation, the dielectric in the scribe lines may crack in the vicinity of the bond pads, and that these cracks may propagate to the dies. This problem becomes more acute when low-k dielectric materials (including extreme low k, ELK and ultra low k, ULK) are used for the ILD material, because low-k dielectric materials are more brittle than high k dielectrics.

It is desirable to decrease the failure rate during the die saw process, which in turn will result in a higher production yield.

SUMMARY OF THE INVENTION

In some embodiments, an interconnect structure includes at least a first interconnect layer and a second interconnect layer. Each of the first and second interconnect layers has a pad structure and each pad structure has a respective pad density. The pad density of the pad structure of the second interconnect layer is different from the pad density of the pad structure of the first interconnect layer. The pad structures of the first and second interconnect layers are connected to each other.

In some embodiments, a wafer includes a semiconductor substrate and an interconnect structure formed above the substrate, including at least a first interconnect layer and a second interconnect layer. Each of the first and second interconnect layers has a pad structure, each pad structure having a respective pad density. The pad structures of the first and second interconnect layers are connected to each other. The pad density of the pad structure of the second interconnect layer is different from the pad density of the pad structure of the first interconnect layer.

In some embodiments, a method for fabricating an interconnect structure includes forming at least a first interconnect layer and a second interconnect layer over a substrate and providing each of the first and second interconnect layers with a pad structure. Each pad structure has a respective pad density. The pad density of the pad structure of the second interconnect layer is different from the pad density of the pad structure of the first interconnect layer. The pad structures of the first and second interconnect layers are connected to each other.

DETAILED DESCRIPTION

Figure 1:
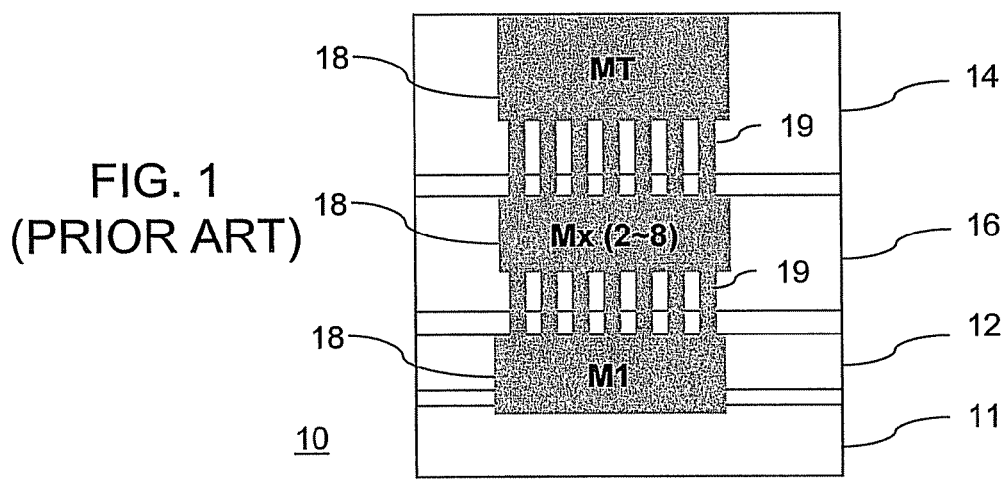
FIG. 1 is a cross sectional view of a sequence of aligned bond pads in a conventional interconnect structure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIGS. 4A-4G are plan views, each showing a respectively different example of a bond pad structure described in greater detail below, but referenced in this paragraph to introduce the concept of pad density. Each of the bond pad structures in FIGS. 4A-4E includes one or more metal areas and one or more non-metallized areas. The term, "pad density" is used herein to denote the ratio of the total metal area within a pad structure to the total area of that pad structure. Embodiments are described below, in which at least two of the interconnect levels have respective pad structures with respectively different pad densities. The term "average pad density" is used herein to denote an average (e.g., arithmetic mean, median or mode) of the pad densities of the PCM pads in each level beginning at the first (M1) interconnect level and ending with the top metal (MT) level. Thus, the average pad density can be calculated as the average of the pad densities of a sequence of aligned bond pads in each level from M1 to MT.

As noted above, as a result of the bond pads being positioned in the scribe line of a wafer above which the interconnect structure is formed, the PCM pad is susceptible to cracking when the PCM pad is cut by the die saw. The inventors have determined that the bond pad density and average pad density are two significant causes of the cracking.

The inventors have further determined that the pad density of the bond pads in the scribe line is correlated with dielectric cracking failures during the singulation process in two different ways: (1) the failure rate increases when the average pad density taken over all the interconnect levels exceeds a first threshold; and (2) the failure rate increases when the pad density within any single one of the interconnect layers exceeds a second threshold that is greater than the first threshold.

An interconnect or structure, including conductive lines, connecting vias and inter level dielectric (ILD) layers, is provided over the top surface of the substrate over the device region. Those of ordinary skill in the art are familiar with structures and techniques for forming interconnects. The interconnect structure includes multiple levels of interconnects, such as metal one (M1) to metal nine (M9) levels, formed between the semiconductor device layer and the external surface. The conductive traces can comprise Cu, Al, AlCu, W, alloys thereof or other conductive materials.

FIG. 1 is a cross sectional diagram of a sequence of vertically aligned PCM pads in a conventional interconnect structure 10. The underlying semiconductor wafer, and any active device layers are denoted by layer 11. The M1 interconnect layer 12 and the MT top metal layer 14 are separated by a plurality of intermediate (Mx) layers 16, having identical PCM pads 18. Only one of the intermediate Mx levels 16 is shown, but it will be understood that the other intermediate levels have the same PCM pad structure 18. The other bond pads (not shown) in each level have the same configuration and characteristics. The bond pads 18 of each layer are connected to the bond pads of an adjacent layer by vias 19. FIG. 1 also shows etch stop layers (not numbered) between each of the interconnect levels 12, 14, 16, and between the substrate 11 and the M1 level 12.

In order to allow probe testing, the conventional multi-level interconnect structure 10 utilizes high density bond pads 18 in the MT (top metal) layer. Because each bond pad 18 is identical to the bond pad 18 in the other levels, each interconnect layer M1 to MT has high density bond pads. A pad density of about 50% to about 85% is sufficient to allow probe testing, with a pad density of about 60% to about 65% being preferred. The use of bond pads 18 having high pad density in each interconnect level 12, 14, 16 results in the interconnect structure 10 having a large average pad density (i.e., average pad density taken across all of the interconnect layers). Due to the cumulative effect in a multi-level structure 10 having a large average pad density, the cracking failure rate is a problem, particularly if the average pad density is about 65% or greater.

Figure 2:
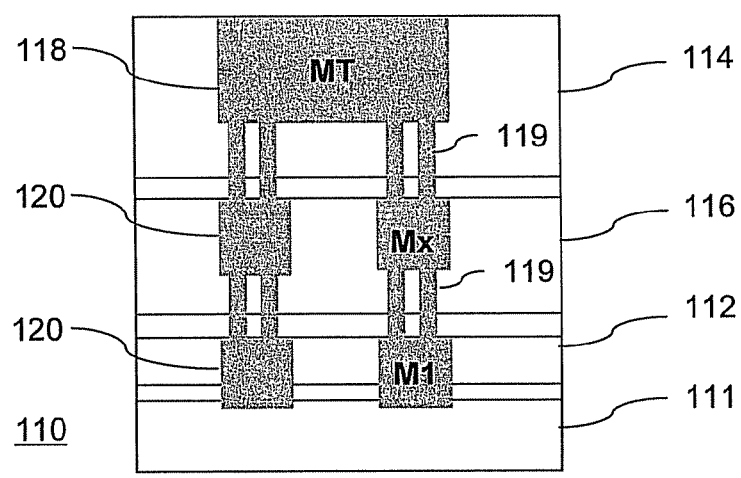
FIG. 2 is a cross sectional view of a sequence of aligned bond pads in an exemplary embodiment of an interconnect structure.
Figure 3:
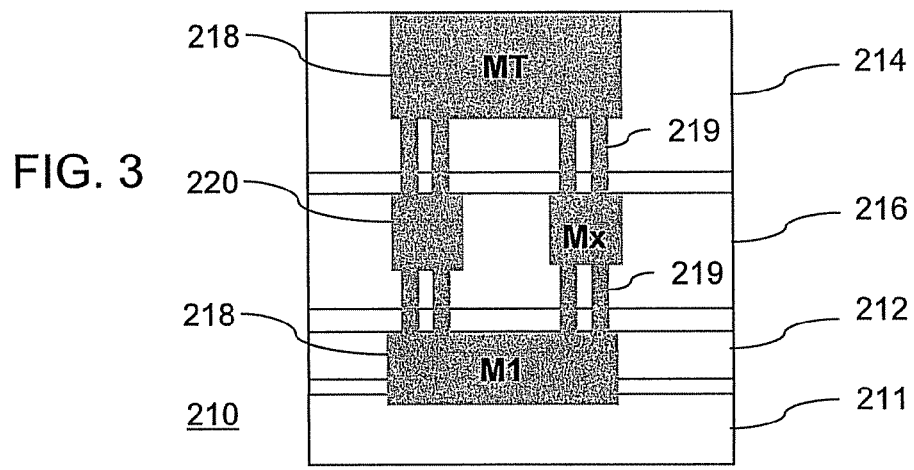
FIG. 3 is a cross sectional view of a sequence of aligned bond pads in another exemplary embodiment of an interconnect structure.

FIGS. 2 and 3 show exemplary embodiments providing a PCM structure with a relatively lower pad density in at least one layer, and/or a relatively lower average pad density taken across all the interconnect levels. This is achieved by having at least two interconnect levels, each having a respectively different pad density. By varying the pad density throughout the different layers of the interconnect structure, some bond pads are more dense to allow probe testing, while one or more other bond pads are less dense, effectively lowering the average pad density of the interconnect structure. In some embodiments, only the PCM pads of the MT level have a relatively high density to allow probe testing during WAT, and all the other interconnect levels have a relatively lower density. In other embodiments, in addition to the MT level, the M1 level also has high pad density, to allow in situ probe testing before forming the M2 level; the intermediate levels have pad structures with relatively lower pad density.

In order to prevent cracking during the die saw process, it is preferred to have an interconnect structure with an average pad density of about 50% or less. At least one layer has a pad structure with a pad density sufficient to allow testing of a circuit to which the pad structure is connected. In some embodiments, at least the top metal (MT) layer of the interconnect structure has a pad density (e.g., 50% to 85%) sufficient to allow probe testing. In some embodiments, at least the first metal (M1) layer of the interconnect structure has a pad density sufficient to allow in situ testing. In order for the interconnect structure to have an average density of about 50% or less and still have at least one interconnect layer with sufficient pad density to allow probe testing, it is thus preferred to have at least one interconnect layer having a pad structure with a pad density of 50% or less. In some embodiments at least one interconnect layer has a pad structure with a pad density from about 10% to about 50%. In some embodiments, at least one interconnect layer has a pad structure with a pad density from about 20% to about 40%.

Table 1 below illustrates the calculation of the average pad density for an exemplary interconnect structure utilizing nine interconnect layers. Each row represents interconnect configurations utilizing a total of nine layers. The first row of data corresponds to an interconnect having eight levels with high pad density and one level with low pad density. The second row of data corresponds to an interconnect having seven levels with high pad density and two levels with low pad density. The number of low pad density layers increases with each row, until the last row, which has zero levels with high pad density and nine levels with low pad density.

The first column represents the number of layers with high pad density (HPD) among nine total layers within the interconnect structure. In this example, each HPD layer contains a pad structure having a pad density (PD) of 65% and thus allows probe testing. On the other hand, the second column represents the number of layers with low pad density (LPD) among the nine total layers within the interconnect structure. Each LPD layer contains a pad structure having a PD of x %, where x has a different value in each column. The variable PD is specified in the subsequent columns, ranging from 20% to 65%. Lastly, the average pad density (APD) of the interconnect structure is calculated, taking into account the number of HPD layers, the number of LPD layers, and the respective PD of the LPD layers. The result is an interconnect structure having a lower average density through the use of one or more LPD layers having pad structures with two or more pad densities.

TABLE 1

| High Pad Density (HPD) Layers (65% PD) | Low Pad Density Layers (LPD) (x % PD) | Average Pad Density (APD) of the Interconnect Structure (%) | | | | |
|---|---|---|---|---|---|---|
| | | Pad density of LPD Layers (20% PD) | Pad density of LPD Layers (30% PD) | Pad density of LPD Layers (40% PD) | Pad density of LPD Layers (50% PD) | Pad density of LPD Layers (65% PD) |
| 8 | 1 | 60.0 | 61.1 | 62.2 | 63.3 | 65.0 |
| 7 | 2 | 55.0 | 57.2 | 59.4 | 61.7 | 65.0 |
| 6 | 3 | 50.0 | 53.3 | 56.7 | 60.0 | 65.0 |
| 5 | 4 | 45.0 | 49.4 | 53.9 | 58.3 | 65.0 |
| 4 | 5 | 40.0 | 45.6 | 51.1 | 56.7 | 65.0 |
| 3 | 6 | 35.0 | 41.7 | 48.3 | 55.0 | 65.0 |
| 2 | 7 | 30.0 | 37.8 | 45.6 | 53.3 | 65.0 |
| 1 | 8 | 25.0 | 33.9 | 42.8 | 51.7 | 65.0 |
| 0 | 9 | 20.0 | 30.0 | 40.0 | 50.0 | 65.0 |

The following examples illustrate the calculations used in determining the average density in Table 1:
EX1: Number of HPD layers (65% PD): 0; Number of LPD layers: 9; HPD pad density: 65%;
(1) If LPD pad density is 20%, average density: $(0 \times 65\% + 9 \times 20\%)/(0 + 9) = 20\%$
(2) If LPD pad density is 50%, average density: $(0 \times 65\% + 9 \times 50\%)/(0 + 9) = 50\%$
EX2: Number of HPD layers (65% PD): 6; Number of LPD layers: 3; HPD pad density: 65%;
(1) If LPD pad density is 20%, average density: $(6 \times 65\% + 3 \times 20\%)/(6 + 3) = 50\%$
(2) If LPD pad density is 50%, average density: $(6 \times 65\% + 3 \times 50\%)/(6 + 3) = 60\%$ Table 1 shows that for a 9 level interconnect structure, based on the use of HPD pads with 65% PD, if the PD of the LPD levels is 20% or 30%, configurations with at least four LPD levels provide an APD less than 50%. If the PD of the LPD levels is 40%, configurations with at least six LPD levels provide an APD less than 50%. One of ordinary skill can readily determine the APD for configurations in which the HPD pad density or LPD pad density differs from the values in Table 1.

FIG. 2 shows an embodiment of an interconnect 110 (above substrate 111), in which a first interconnect layer 112 is a bottom metal (M1) layer having a bond pad 120, and a second interconnect layer 114 is a top metal (MT) layer having a bond pad 118. The bond pads in each level are connected to bond pads in an adjacent level by vias 119. To allow probe testing, a pad density from about 50% to about 85% is used in the MT level 114, with a pad density from about 60% to about 65% in the MT level being preferred. The pad density in at least one of the lower (M1 to Mx−1) levels 112, 116 is less than the pad density in the MT level. The pad density of LPD pad structure 120 of bottom metal layer 112 is less than the pad density of pad structure 118 of top metal layer 114. Furthermore, interconnect structure 110 may have one or more intermediate metal (Mx) layers 116 disposed between bottom metal layer 112 and top metal layer 114. Each intermediate metal layer 116 contains a respective pad structure 120. If there is only one intermediate metal layer 116, it is preferred that the pad density of pad structure 120 within that layer is less than the pad density of pad structure 118 of top metal layer 114. If there is more than one intermediate metal layer 116, it is preferred that at least one intermediate metal layer 116 has an LPD pad structure 120 having a pad density that is less than the pad density of HPD pad structure 118 of top metal layer 114. In FIG. 2, the top metal (MT) level 114 has an HPD pad structure 118, and the rest of the levels 112, 116 have LPD pad structures 120, with all of the LPD pad structures having the same pad density as each other.

In other embodiments (not shown), the LPD pad structures 120 may be different from each other, and may have the same or different pad densities; but all of the LPD pad structures have lower pad density than the HPD structure 118 of the MT level.

In some other embodiments (not shown), the intermediate levels may include a combination of one or more levels with HPD pads and one or more levels with LPD pads.

FIG. 3 shows another embodiment of an interconnect structure 210 (above substrate 211), in which both the top metal level 214 and M1 level 212 have HPD pads 218. In interconnect structure 210, a first interconnect layer 216 is disposed between a second interconnect layer 214 and bottom metal layer 212. The bond pads 218, 220 in each level are connected to bond pads in an adjacent level by vias 219. In FIG. 3, first interconnect layer 216 is an intermediate metal layer having a bond pad 220, and second interconnect layer 214 is a top metal layer having a bond pad 218. Intermediate metal layer 216 has a pad structure 220 having a pad density that is less than the pad density of pad structure 218 of top metal layer 214 and also less than the pad density of pad structure 218 of bottom metal layer 212. Interconnect structure 210 may further comprise one or more additional intermediate metal layers 216 between bottom metal layer 212 and top metal layer 214. It is preferred that at least one of the additional intermediate metal layers 216 has pad structure 220 having a pad density that is less than the pad density of pad structure 218 of top metal layer 214.

In other embodiments (not shown), the LPD pad structures 220 in intermediate levels M2 through Mx−1 may be different from each other, and may have the same or different pad densities; but all of the LPD pad structures have lower pad density than the HPD structures 218 of the MT level and the M1 level 212.

FIGS. 4A-4G show examples of various arrangements of pad structures having at least one metal area 24 and at least one area without metal 26 resulting in different pad densities. For ease of demonstrating pad density calculations, the bond pads of FIGS. 4A-4G are all assumed to be sized 70 μm by 50 μm, but any size bond pad may be used with any of the configurations.

Figure 4A:
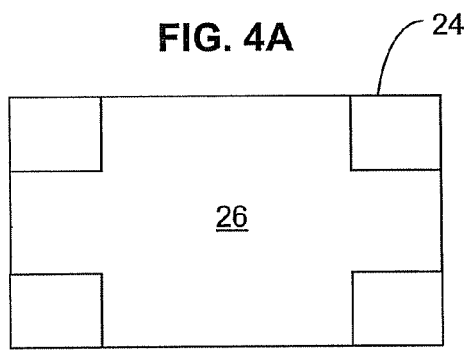
FIG. 4A-4G are plan views of various embodiments of pad structures suitable for use in the interconnects of FIGS. 2-3.

FIG. 4A shows an LPD pad configuration having four metal areas 24 in the corners, each metal area 10 μm by 10 μm. The remaining area 26 does not have metal. The pad density is the ratio of the metal area 24 to the total area (24 plus 26), the ratio equal to

[4×(10×10)]/(70×50)=0.11.

Figure 4B:
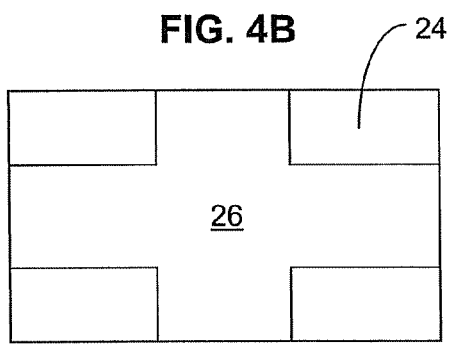

FIG. 4B shows an LPD pad in which each of the metal areas 24 is 20 μm by 10 μm. The remaining area 26 does not have metal. The pad density is equal to

[4×(20×10)]/(70×50)=0.23.

Figure 4C:
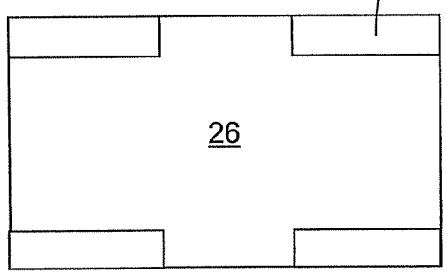

FIG. 4C shows an LPD pad in which each of the metal areas 24 is 20 μm by 5 μm. The remaining area 26 does not have metal. The pad density is equal to

[4×(20×5)]/(70×50)=0.11.

Figure 4D:
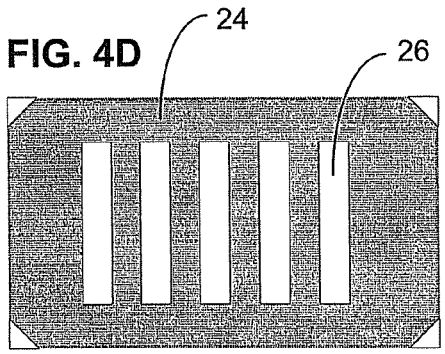

FIG. 4D shows an HPD pad in which each of the five non-metallized areas 26 is 40 μm by 2.6 μm. The remaining area 24 has metal. The pad density is equal to

[(70×50)−5×(40×2.6)]/(70×50)=0.85.

Figure 4E:
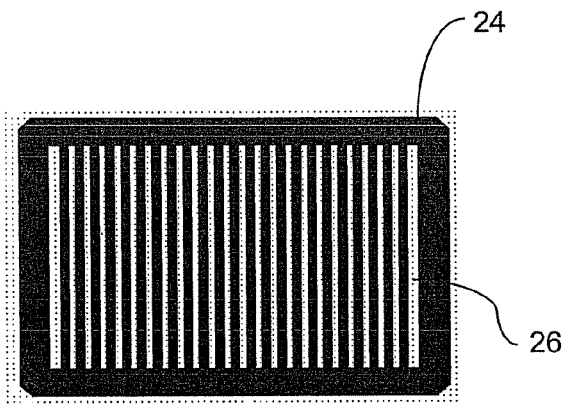

FIG. 4E shows another HPD configuration.

Figure 4F:
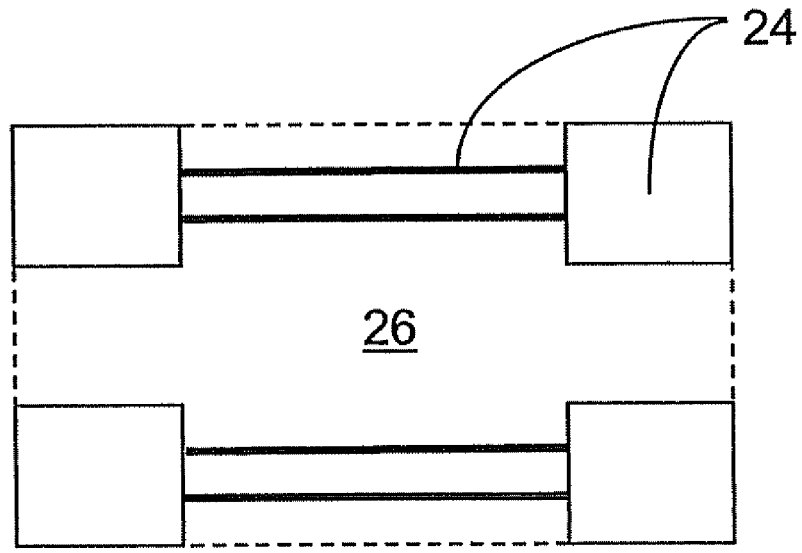
Figure 4G:
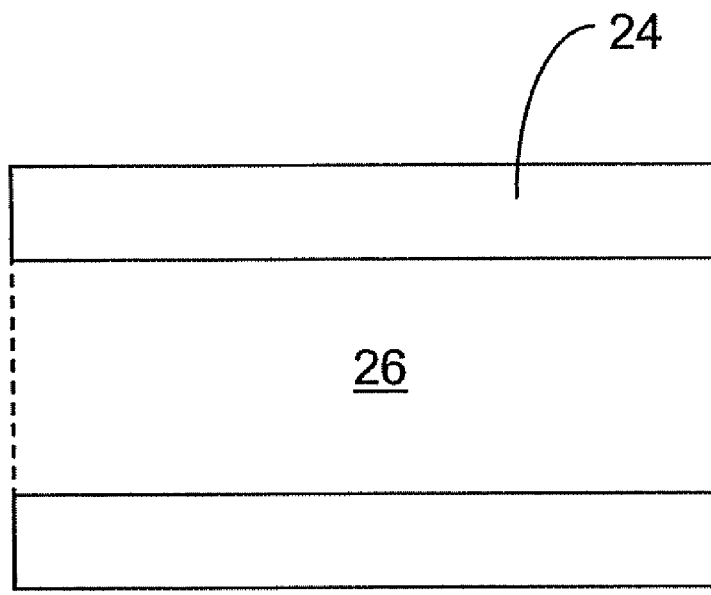

FIGS. 4F and 4G show two other LPD configurations.

The configurations of FIGS. 4A to 4G are only exemplary. Other pad structure configurations may be used.

Figure 5A:
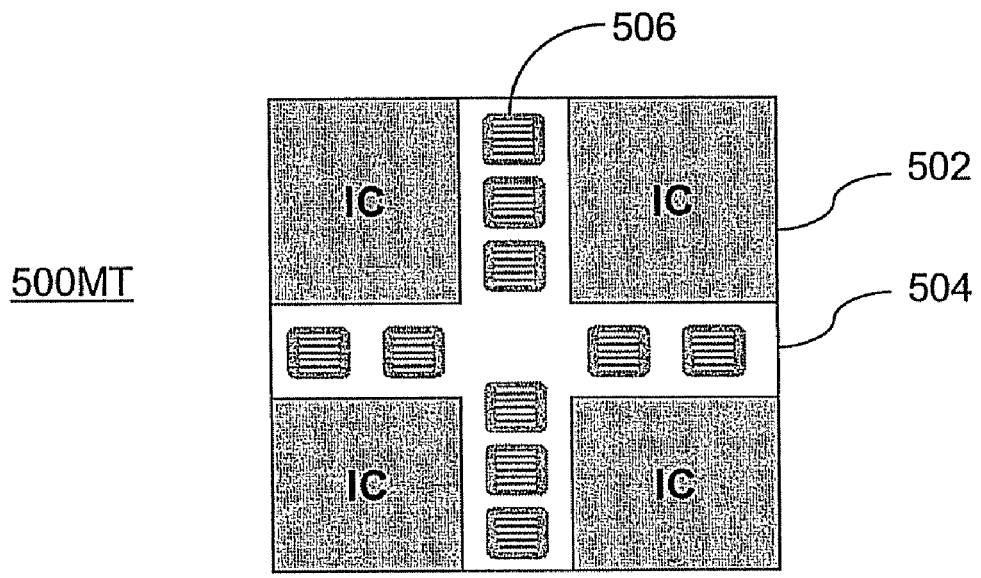
FIG. 5A-5B are cross sectional views of a wafer incorporating bond pads as shown in FIGS. 4A and 4D.
Figure 5B:
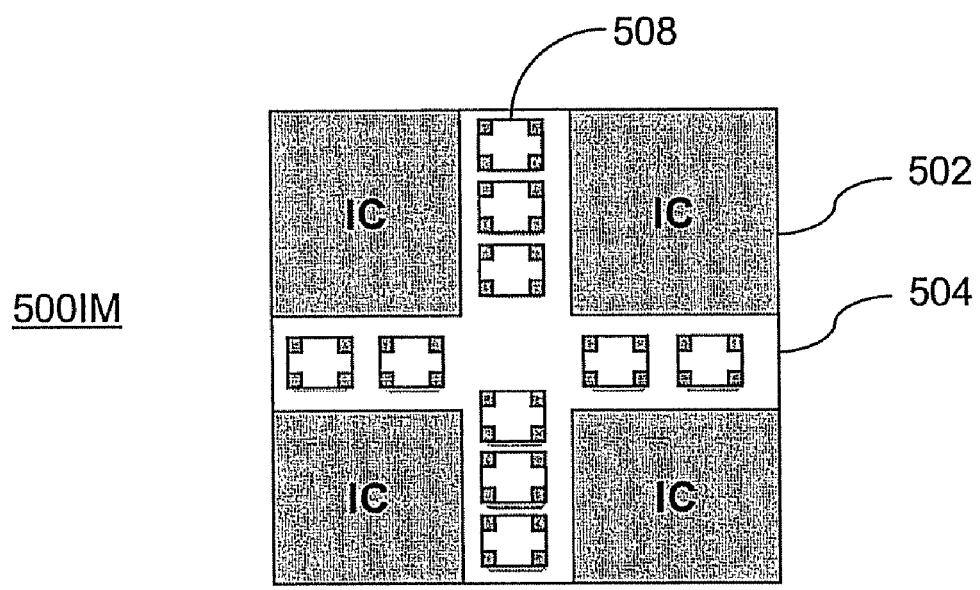

FIGS. 5A-5B are two different sectional views of a portion of a single wafer including bond pads according to the embodiments shown in FIGS. 4A and 4D. It is understood that a typical whole wafer has many dies, but only a portion containing 4 dies is shown for ease of explanation. FIG. 5A shows a plan view of the top interconnect level of a wafer 500MT having a plurality of dies 502 and a plurality of scribe lines 504 disposed therebetween, above the substrate. Each scribe line 504 runs between adjacent dies 502, along which wafer 500MT is cut by a die saw during a die saw process. The scribe line has a plurality of HPD bond pads 506, which may be of the type shown in FIG. 4D or 4E (or other HPD bond pad).

FIG. 5B is a cross sectional view of an intermediate interconnect level 500IM in the same wafer shown in FIG. 5A. The intermediate level 500IM has a plurality of LPD pad structures 508 in the scribe line 502, each having a pad density less than the pad density of the pads 506 in the top metal (MT) layer 500MT. The LPD pads lie within the plurality of scribe lines 504, and are aligned with the pads of top metal layer 500MT. FIG. 5B shows LPD pads of the type shown in FIG. 4A, but other LPD pads, such as but not limited to, any of those shown in FIGS. 4A, 4B, 4C, 4F and 4G, or other LPD pads. Also, the M1 level may include either HPD or LPD bond pads, as discussed above.

The same wafer shown in FIGS. 5A and 5B may have one or more additional interconnect levels with HPD bond pads, and/or one or more additional interconnect levels with LPD bond pads.

As noted above, some embodiments have an average pad density less than a first threshold and a maximum pad density for an individual less than a second threshold. The values of the first and second thresholds depend on a variety of other parameters that affect the crack failure rate, such as cut width, die saw speed, die saw temperature, die saw pressure and the like. For example, under one set of conditions, the inventors have observed an increased rate of cracking failures when the average pad density is 70%, but under otherwise similar conditions, the failure rate was acceptable with only one level having a pad density of 70% and the rest of the levels having a lower pad density. On the other hand, with only a single level having a pad density of 100%, the crack failure rate was unacceptable.

For example, in some embodiments, the individual pad density in each layer is about 65% or less, and the average pad density over all layers of the interconnect structure is about 50% or less.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An interconnect structure comprising:
at least a first interconnect layer and a second interconnect layer, each of the first and second interconnect layers having a pad structure, each pad structure having a respective pad density, wherein the pad density of the pad structure of the second interconnect layer is different from the pad density of the pad structure of the first interconnect layer, wherein the pad structures of the first and second interconnect layers are connected to each other, and wherein the pad structure of the first interconnect layer has a pad density from about 10% to about 50%.

2. The interconnect structure of claim 1, wherein the first interconnect layer is a bottom metal layer, the second interconnect layer is a top metal layer, and the pad density of the pad structure of the bottom metal layer is less than the pad density of the pad structure of the top metal layer.

3. The interconnect structure of claim 2, further comprising one or more intermediate metal layers between the bottom metal layer and the top metal layer, each of the intermediate metal layers having at least one pad structure with a pad density that is less than the pad density of the pad structure of the top metal layer.

4. The interconnect structure of claim 2, wherein the pad structure of the second interconnect layer is exposed at a surface thereof, so as to be accessible for wafer acceptance testing.

5. The interconnect structure of claim 1, further comprising a bottom metal layer having a pad structure with a pad density,
wherein the second interconnect layer is a top metal layer, the first interconnect layer is an intermediate metal layer between the bottom metal layer and the top metal layer, and wherein the pad density of the pad structure of the intermediate metal layer is less than the pad density of the pad structure of the top metal layer and less than the pad density of the pad structure of the bottom metal layer.

6. The interconnect structure of claim 5, further comprising one or more additional intermediate metal layers between the bottom metal layer and the top metal layer, each of the additional intermediate metal layers having at least one pad structure with a pad density less than the pad density of the pad structure of the top metal layer.

7. The interconnect structure of claim 1, wherein the interconnect structure has an average pad density of about 50% or less.

8. The interconnect structure of claim 7, wherein the second interconnect layer has a pad density between about 50% and about 85%.

9. The interconnect structure of claim 7, wherein:
the first interconnect layer is a bottom metal layer, and the first interconnect layer has a pad density less than the first interconnect layer; and
the second interconnect layer is a top metal layer, and the second interconnect layer has a pad density of about 50%.

10. The interconnect structure of claim 1, wherein the first interconnect layer has a pad density from about 20% to about 40%.

11. The interconnect structure of claim 1, wherein the pad structure of at least one of the first and second interconnect layers comprises a plurality of metal areas and at least one area without metal.

12. The interconnect structure of claim 1, wherein the pad structure lies on a scribe line of a wafer above which the interconnect structure is formed.

13. The interconnect structure of claim 12, wherein:
the pad structure of the second interconnect layer has a pad density sufficient to allow probe testing of a circuit to which the pad structure of the second interconnect layer is connected; and
the interconnect structure includes one or more intermediate metal layers having at least one pad with a pad density that is not sufficient to allow probe testing.

14. A wafer comprising:
a semiconductor substrate;
an interconnect structure formed above the substrate, including at least a first interconnect layer and a second interconnect layer, each of the first and second interconnect layers having a pad structure, each pad structure having a respective pad density, the pad structures of the first and second interconnect layers being connected to each other, wherein the pad structure of the first interconnect layer has a pad density from about 10% to about 50%,
wherein the pad density of the pad structure of the second interconnect layer is different from the pad density of the pad structure of the first interconnect layer.

15. The wafer of claim 14, wherein the first interconnect layer is a bottom metal layer, the second interconnect layer is a top metal layer, and the pad density of the pad structure of the bottom metal layer is less than the pad density of the pad structure of the top metal layer.

16. The wafer of claim 15, further comprising one or more intermediate metal layers between the bottom metal layer and the top metal layer, each of the intermediate metal layers having at least one pad structure with a pad density that is less than the pad density of the pad structure of the top metal layer.

17. The wafer of claim 14, further comprising a bottom metal layer having a pad structure with a pad density,
wherein the second interconnect layer is a top metal layer, the first interconnect layer is an intermediate metal layer between the bottom metal layer and the top metal layer, and
wherein the pad density of the pad structure of the intermediate metal layer is less than the pad density of the pad structure of the top metal layer and less than the pad density of the pad structure of the bottom metal layer.

18. The wafer of claim 17, further comprising one or more additional intermediate metal layers between the bottom metal layer and the top metal layer, each of the additional intermediate metal layers having at least one pad structure with a pad density less than the pad density of the pad structure of the top metal layer.

19. The wafer of claim 14, wherein the semiconductor substrate has at least two integrated circuit dies formed thereon and a scribe line between the integrated circuit dies, and the pad structure lies in the scribe line of the substrate.

20. The wafer of claim 15, wherein the pad structure of the second interconnect layer is exposed at a surface thereof, so as to be accessible for wafer acceptance testing.

* * * * *